(12) United States Patent
Cirillo et al.

(10) Patent No.: US 10,670,631 B2
(45) Date of Patent: Jun. 2, 2020

(54) METHOD AND A MEASURING DEVICE FOR INVESTIGATING SIGNAL PARAMETERS

(71) Applicant: Rohde & Schwarz GmbH & Co. KG, Munich (DE)

(72) Inventors: Luke Cirillo, Poing (DE); Andreas Lagler, Rosenheim (DE); Clemens Lohmer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 685 days.

(21) Appl. No.: 15/166,627

(22) Filed: May 27, 2016

(65) Prior Publication Data

US 2017/0059617 A1 Mar. 2, 2017

(30) Foreign Application Priority Data

Sep. 2, 2015 (DE) .......................... 10 2015 216 758

(51) Int. Cl.
*G01R 13/02* (2006.01)
*G01R 29/08* (2006.01)

(52) U.S. Cl.
CPC ..... *G01R 13/0218* (2013.01); *G01R 13/0245* (2013.01); *G01R 29/0892* (2013.01)

(58) Field of Classification Search
CPC .......... G01R 13/00; G01R 23/16; G06K 9/62; G06T 11/20
See application file for complete search history.

(56) References Cited

U.S. PATENT DOCUMENTS

| 7,873,486 B2 | 1/2011 | Earls | |
| 7,889,198 B2 | 2/2011 | Nara | |
| 10,024,895 B1* | 7/2018 | Melis | G01R 23/16 |
| 2006/0033845 A1* | 2/2006 | Park | G06T 5/20 |
| | | | 348/630 |
| 2009/0248336 A1 | 10/2009 | Afgani et al. | |
| 2010/0260354 A1* | 10/2010 | Ozawa | G10L 21/0208 |
| | | | 381/94.4 |
| 2011/0280489 A1 | 11/2011 | Turpin et al. | |
| 2012/0194823 A1* | 8/2012 | Moore | G01B 9/02004 |
| | | | 356/479 |
| 2013/0080073 A1* | 3/2013 | de Corral | G01N 30/86 |
| | | | 702/23 |
| 2013/0207929 A1* | 8/2013 | Farmer | G01R 13/029 |
| | | | 345/174 |
| 2014/0142880 A1* | 5/2014 | Dobyns | G01R 23/165 |
| | | | 702/76 |

FOREIGN PATENT DOCUMENTS

EP 1845385 10/2007

* cited by examiner

*Primary Examiner* — Catherine T. Rastovski

(74) *Attorney, Agent, or Firm* — Lee & Hayes, P.C.

(57) ABSTRACT

The invention relates to a method for investigating signal parameters in an electrical measuring device with a display element with the method steps: display of a detected signal on the display element, manual masking of at least one signal component of the signal by a user by means of a masking element of the measuring device and investigation of signal parameters from the masked signal component or from the unmasked signal component of the signal by the measuring device. At least one further signal parameter is also investigated alongside the time duration and the bandwidth of the masked signal component. According to the invention, a corresponding measuring device is also provided.

16 Claims, 10 Drawing Sheets

METHOD AND A MEASURING DEVICE FOR INVESTIGATING SIGNAL PARAMETERS

FIELD OF THE INVENTION

The present invention relates to a method for investigating signal parameters in an electrical measuring device with a display element and a measuring device. In this context, a manual masking of signal components of a displayed, detected signal is preferably implemented in a time-frequency plane for the subsequent determination of signal parameters.

BACKGROUND OF THE INVENTION

Contemporary signal-transmission methods, for example, mobile-radio communications methods or radar methods, make increasingly frequent use of complex digital-modulation methods, so that the signals to be transmitted can only be analysed with difficulty. The signals to be transmitted are therefore observed by means of an electrical measuring device, for example, a network analyser, in order to detect possible errors or interfering influences in the transmission method. For this purpose, such electrical measuring devices comprise a display element in order to display the detected signal, for example, in the form of amplitude spectrograms, power spectrograms, especially in a two-dimensional frequency-time plane.

Analysis methods are known in which the signal is displayed on a display element of a measuring device as an amplitude spectrogram or a waterfall diagram. As a result of the small signal-noise ratio of individual signal components in the detected signal, relevant or respectively interesting signal components are sometimes not identified by the user in the display selected. To ensure that a user discovers in the diagram all coherent signal components of the signal to be detected, the document proposes the use of an automated recognition method for the signals detected. Coherent signal components are therefore investigated by means of this automation and also correspondingly investigated in the diagram. This is particularly meaningful in the case of frequency-hopping methods in order to identify coherent signal components more readily. This automated recognition should allow especially inexperienced users of a measuring device to recognise all of the signal elements associated with a signal component.

SUMMARY OF THE INVENTION

One object of the present invention among others is therefore to provide a method which allows a user to analyse a signal in an improved manner. In particular, it should be possible to analyse interesting signal components of a detected signal more accurately. In this context, the method should not be calculation-intensive and should be simple to perform. Furthermore, a measuring device should be provided for the execution of the method.

One aspect of the invention concerns a method for investigating signal parameters in an electrical measuring device with a display element. The method initially comprises the method step of displaying a detected signal on the display element.

The detected signal is, for example, a high-frequency signal, which is preferably digitally modulated, for example, by means of a phase-shift-keying (abbreviation: PSK), or quadrature-phase-shift-keying (abbreviation: QPSK), an amplitude modulation, such as quadrature-amplitude-modulation (abbreviation: QAM) or a frequency-multiplex method, such as OFDM. Other modulation methods or coding methods in the signal to be detected are not excluded by the invention. Alternatively or additionally, the detected signal is a radar signal, for example, an impulse-radar signal, or a modulated radar signal.

The method according to the invention further comprises the method step of manual masking of at least one signal component of the signal by means of a masking element of the measuring device. The masking element is preferably a touch-sensitive screen or another input device of the measuring device. For example, a computer mouse, a cursor, a keyboard, touchpad or similar can be provided in the measuring device as an input device. This masking element of the measuring device is used in order to allow a user to perform a manual masking of signal regions. The selection of the signal component is made on the basis of the already displayed, detected signal. In this context, for example, disturbed signal components which should be observed in greater detail may be prominent in the detected signal. Alternatively or additionally, less visible disturbances, for which a more accurate analysis by means of the method described here is required, may also be of interest.

In this context, only one single signal component may be of interest, which is masked, for example, manually. Alternatively or additionally, several signal components may be present within one masking, wherein these signal components are displayed coherently or separately from one another.

According to the invention, the method further comprises an investigation step, wherein signal parameters from the masked signal region of the signal or from an unmasked signal component of the signal are investigated for this purpose by the measuring device.

Investigating the plurality of signal parameters of the masked region means that the masked region can be expressed through a substantially simplified signal model. The investigated signal parameters accordingly describe the model on the basis of which a further analysis of the detected signal can be implemented. In this manner, statements can be made regarding which signal parameters are present in a masked region of the signal.

Investigating the plurality of signal parameters of the unmasked region means that the unmasked region can be expressed through a substantially simplified signal model. The investigated signal parameters accordingly describe the model on the basis of which a further analysis of the detected signal can be implemented. In this manner, statements can be made regarding which signal parameters are present in an unmasked region of the signal.

Whether the signal parameters are selected from the masked signal component or the unmasked signal component is decided, for example, by a user input or automatically on the basis of the size of the masking.

In a preferred embodiment, the user masks the signal component by means of a finger touch on the touch-sensitive screen as the masking element of the measuring device. In this context, the masking can be implemented, for example, by means of the index finger, wherein a finger-stroke masks the signal component. A zoom function before or respectively during the masking can also be supported by the touch-sensitive screen for further simplification of the masking.

In a preferred embodiment, at least one further signal parameter can also be investigated alongside the time duration and the bandwidth of the masked signal component.

In particular, the start frequency, the stop frequency, the start time, the stop time, the chirp rate or respectively sweep rate and/or the angle of the signal component within a frequency-time plane, abbreviated as the f/t-plane of the masked signal component, may preferably be considered as further signal parameters, wherein this list is not exhaustive.

The chirp rate is understood in signal analysis as the change in frequency per unit of time in the case of a signal with frequency changing against time. Accordingly, a distinction is made between a positive chirp, in which the frequency increases against time, and a negative chirp, in which the frequency decreases against time. Such chirp rates are contained, in particular, in radar signals, in order to filter radar responses of remote reflexes out of the noise of the signal. Such a chirp can also be disposed within the detected signal, for example, as an interfering signal, and is investigated by the method according to the invention.

A sweep is understood as a frequency-dependent analysis with a continuous frequency. The sweep rate is understood as the change in the analysis frequency per unit of time.

Alternatively or additionally, an angle in the f/t-plane should preferably be determined as a further parameter. The so-called f/t plane is a special display of the detected signal. In this context, the signal is displayed on a two-dimensional plane dependent upon the frequency f and the time t. If a signal which experiences a time change over a given frequency range is displayed in this manner, this signal is displayed with a given angle in the two-dimensional diagram.

Alternatively or additionally, it is preferably possible to investigate as a further signal parameter whether the masked signal component or the unmasked signal component relates to control information or payload information of the detected signal. With this signal parameter, it is possible to make statements regarding whether the signal source has already been disturbed or whether the radio method is subject to interference. For this purpose, the masked signal component or the unmasked signal component is, for example, demodulated and/or decoded, which is implemented by means of a computer unit in the measuring device.

The degree of a polynomial which describes the masked signal component or the unmasked signal component is also understood as a preferred further signal parameter.

By means of this further signal parameter, the masked signal regions or the unmasked signal components can be classified substantially more accurately than if only the bandwidth or the signal duration for these signal components were known. Investigating the at least one further signal parameter allows the masked signal component or the unmasked signal component to be described very accurately. In this manner, similar or identical signal components at another position in the detected signal can be found with a relatively higher security than if only the signal duration and the bandwidth were investigated.

In a preferred embodiment, the detected signal is analysed by means of the investigated signal parameters, wherein signal components of the detected signal with similar or identical investigated signal parameters are determined by means of the measuring device. In an advantageous manner, this therefore means that signal components with similar or identical investigated signal parameters which were not recognised by a user in the displayed, detected signal are now also detected.

Inter alia, investigated signal parameters which, in fact, deviate from the already investigated respective signal-parameter value are understood as similar investigated signal parameters, wherein, however, the deviation is disposed within a predefined tolerance. For example, investigated signal parameters with a deviation of ±10% are interpreted as similar investigated signal parameters. The deviation can be adjusted as an input parameter in the measuring device.

The analysis of the detected signal is then implemented, for example, by means of a filter step. In this context, a digital filter is parameterised with the investigated signal parameters. This filter is then applied to the detected signal, wherein the signal regions with similar signal parameters are marked.

In this manner, at least one further signal parameter is found, with which similar and/or identical signal components in the detected signal can be identified very accurately.

In a preferred embodiment, the determined, analysed signal components of the detected signal are recognisably marked on the display element of the measuring device. For this purpose, a highlighted display of these determined signal components is selected for a user. This can take place especially through a colouring step or respectively a change in contrast of these signal components. For example, dissimilar signal components of the detected signal can also be masked out or displayed with a substantially reduced contrast by comparison with the similar signal components.

In a preferred embodiment, the investigated signal parameters are output on the display element. Accordingly, a user receives the information regarding which signal parameters are associated with the preferably manually masked signal component or respectively with which signal parameters the detected signal has been analysed. By preference, all parameters which have been investigated are output as signal parameters. By means of the parameters displayed, the user can now draw conclusions with regard to any sources of interference or errors in the signal transmission method. For example, if a periodically repeating signal component is determined, the user can infer, for example, the coupling of an interference signal into the transmission pathway of the signal transmission method.

In a preferred embodiment, the masked signal component or the unmasked signal component is approximated and/or interpolated by a polynomial. A method in which prominent positions in the masked signal component or the unmasked signal component are detected, which are then described approximately, that is, approximated or interpolated, by means of a mathematical polynomial, is preferably used as the polynomial approximation or polynomial interpolation. The degree of the polynomial is based upon the number of grid points. For example, if four grid points are identified in the masked signal component or in the unmasked signal component, a third degree polynomial is approximated.

In this context, it should be provided that the larger the number of grid points is, the larger the degree of the polynomial which is to be approximated will be. The parameters which describe the polynomial are converted into the investigated signal parameters and used for the analysis of the detected signal. This conversion provides, for example, a scaling or a matching to the filter properties of the digital filter to be used.

In a preferred embodiment, a window function is applied to the masked signal component or to the unmasked signal component in order to investigate the signal parameters and/or the grid points of the polynomial. The window function is applied to signal components of the detected signal in order to investigate the grid points for a polynomial approximation.

In a preferred embodiment, grid points of the polynomial are determined by means of the window function, wherein, in particular, local-minimum values of the signal within the masked signal component and/or local-maximum value of the signal within the masked signal region are determined.

In a preferred embodiment, grid points of the polynomial are determined by means of the window function, wherein, in particular, the smallest errors squared, that is, the smallest squared deviations of the polynomial at the grid points, are determined.

The window function is preferably aligned especially with the gradient of the masked signal component or of the unmasked signal component. In this manner, the window function experiences a rotation which is aligned dependent upon a vector of the gradient of the signal in the masked signal range. The window function therefore serves to identify the grid points of the polynomial, wherein a vectorial alignment with the gradient of the signal is implemented for this purpose in order to investigate an exact grid-point position. This method is applied especially to the already displayed, detected signal.

In a preferred embodiment, the masked signal component or the unmasked signal component defines a time duration and the bandwidth as a signal parameter which is obtained from the signal data of the detected signal. The signal data are, for example, in-phase data and quadrature-phase data, abbreviated as I/Q data, which are preferably stored in a memory region of the measuring device.

In a preferred embodiment, phase coefficients are approximated directly from the signal data of the masked signal component or of the unmasked signal component, with which a polynomial is then described, which, in turn, describes the masked signal component or the unmasked signal component. Filter coefficients for a filter, which is accordingly relatively noise-freer, are then obtained from the parameters of the polynomial.

In a preferred embodiment, signal components which are rejected for the investigation of the signal parameters are determined by the manual masking. This represents an inverted masking. Accordingly, with the masking element, the user selects signal regions which are not to be used for the analysis of the signal. This corresponds to a kind of notch filtering.

In a preferred embodiment, a threshold-value filter is applied to the masked signal components or the unmasked signal component. Accordingly, signal components below or above a given threshold are ignored. In this manner, the masked signal component can be separated from a pure noise component of the detected signal.

According to another aspect of the invention, an electrical measuring device is also proposed. The electrical measuring device comprises a signal input to which an analog signal to be detected can be connected. The electrical measuring device further comprises an analog/digital converter in order to convert the analog signal into a digital signal to be detected. A display device of the measuring device is provided for the display of the detected digital signal. Furthermore, the measuring device comprises a masking element for the manual masking of at least one signal region of the signal. Furthermore, a computer unit is provided in the measuring device in order to investigate signal parameters from the masked signal component or the unmasked signal component of the signal, wherein at least one further signal parameter is also investigated alongside the time duration and the bandwidth of the masked signal region.

In a preferred embodiment, the masking element is a touch-sensitive screen of the display element or an input device of the measuring device. In particular, a mouse, a trackball, a cursor, a keypad or a keyboard are provided as the input device.

In a preferred embodiment, a determining unit is provided in the measuring device, wherein the determining unit receives the investigated signal parameters, and wherein the determining unit determines signal components of the detected signal with similar or identical signal parameters.

BRIEF DESCRIPTION OF THE DRAWINGS

In the following, the invention and respectively further embodiments and advantages of the invention are explained in greater detail with reference to Figs. of the drawings, wherein the Figs. describe merely exemplary embodiments of the invention by way of example only. Identical components in the Figs. have been provided with identical reference numbers. The Figs. should not be regarded as true to scale. Individual elements of the Figs. may have been illustrated with an exaggerated scale or respectively in a simplified manner. The drawings show.

DETAILED DESCRIPTION OF THE INVENTION

Figure 1:
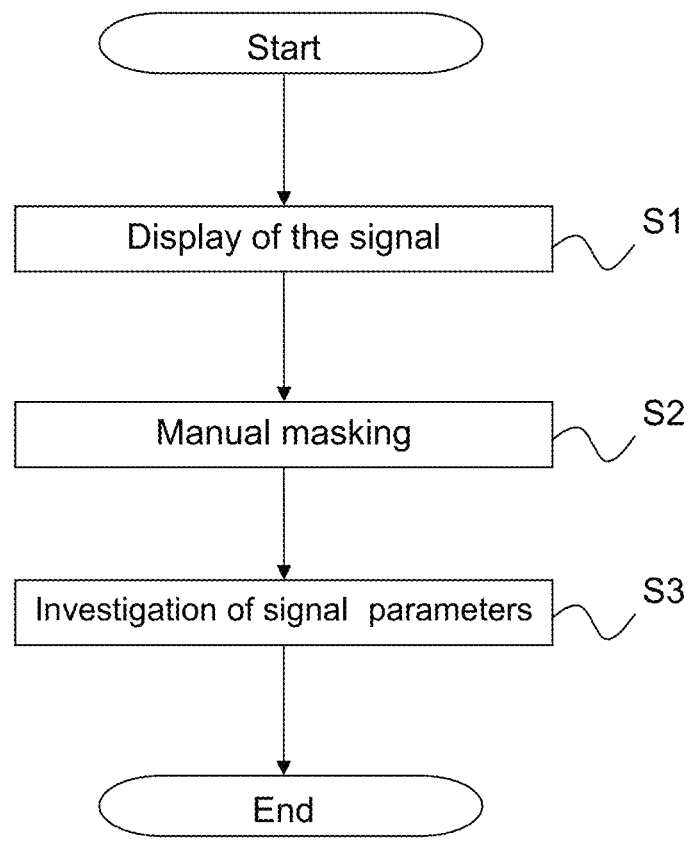
FIG. 1 a first exemplary embodiment of a flow diagram of the method according to the invention.

FIG. 1 shows a first exemplary embodiment of a method according to the invention for investigating signal parameters. In this context, in step S1, a detected signal 12 is displayed. In the following step S2, a manual masking of at least one signal component of the signal is implemented by means of a masking element of the measuring device. The masking is implemented, in particular, by a masking element 6, 6' of a measuring device 1, preferably by a user. In various examples, a masking element can include a touch-sensitive screen 6, or alternatively, an input device 6', such as, e.g., a computer mouse. In this context, for example, a finger stroke via a touch-sensitive screen 6 is possible as the masking of the signal component. A zoom function is preferably offered by means of a touching of the screen, so that the user can perform the masking very accurately by means of a finger touch.

In a following step S3, the investigation of signal parameters from the masked signal region or the unmasked signal component of the detected, displayed signal is implemented by the measuring device 1. By preference, at least one further signal parameter is also investigated alongside the time duration and the bandwidth of the masked signal region. Through the manual masking, the user supplies to the measuring device 1 an information regarding which signal component of the detected signal should be analysed in greater detail or, indeed, which signal component should not be analysed in greater detail, and from which signal component of the detected signal, signal parameters are to be investigated. In this context, the user aims, in particular, to detect similar or identical signal components in the detected signal, which comprise the same properties as the manually masked signal component or the unmasked signal component. In this manner, signal components which are not readily visible which comprise the same signal properties or respectively signal parameters as the masked signal component can be identified.

The selection regarding whether a masked signal component or an unmasked signal component is to be used to investigate the signal parameter, is made, for example, by the user her/himself. For example, it may be simpler to mask the components in the signal which are not to be analysed further. Alternatively or additionally, a selection is made on the basis of the size of the masking regarding whether the masked signal component or the unmasked signal component is to be selected.

Figure 2:
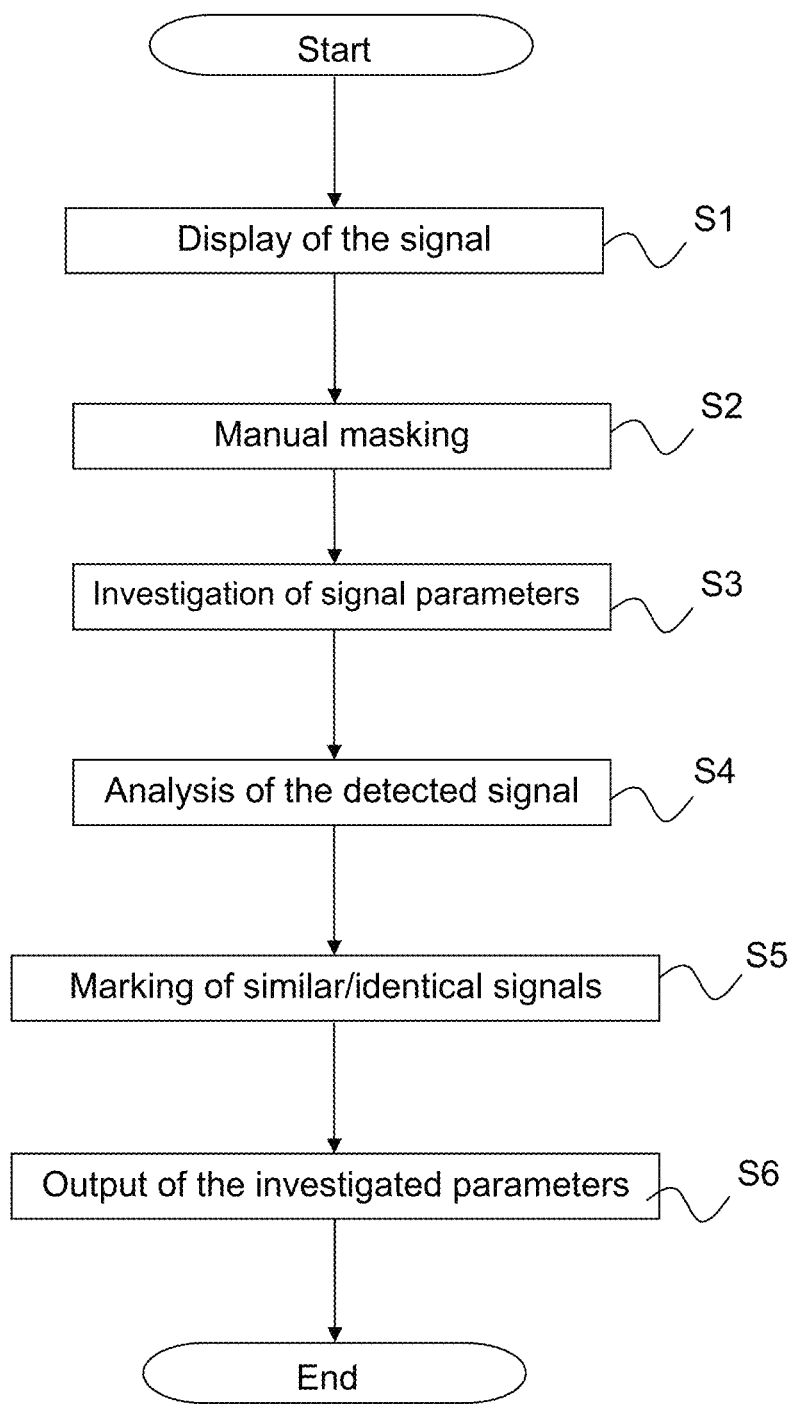
FIG. 2 a second exemplary embodiment of a flow diagram of the method according to the invention.

FIG. 2 shows a second exemplary embodiment of a method according to the invention as a flow diagram. In addition to the steps S1 to S3 already described in FIG. 1, an analysis of the detected signal is now implemented in step S4. In particular, a filter step is used for the analysis of the detected signal. Following the analysis S4 of the detected signal, in the following step S5, a determination of similar or identical signal components of the detected signal is implemented. In this context, these similar or identical signal components can be marked in the display element. Optionally or additionally, in step S6, the investigated signal parameters are output. Step S6 allows the user to see the investigated signal parameters of the signal components s/he has masked.

In this manner, the user can determine how frequently the masked signal component or the unmasked signal component occurs in the detected signal. For example, if the chirp rate has been investigated as a further signal parameter, the user can determine whether the signal transmission method has been additionally disturbed by additional interfering transmitters, for example, radar units disposed in spatial proximity. The user can then introduce countermeasures to reduce or remove the influence of the source of interference.

Figure 3:
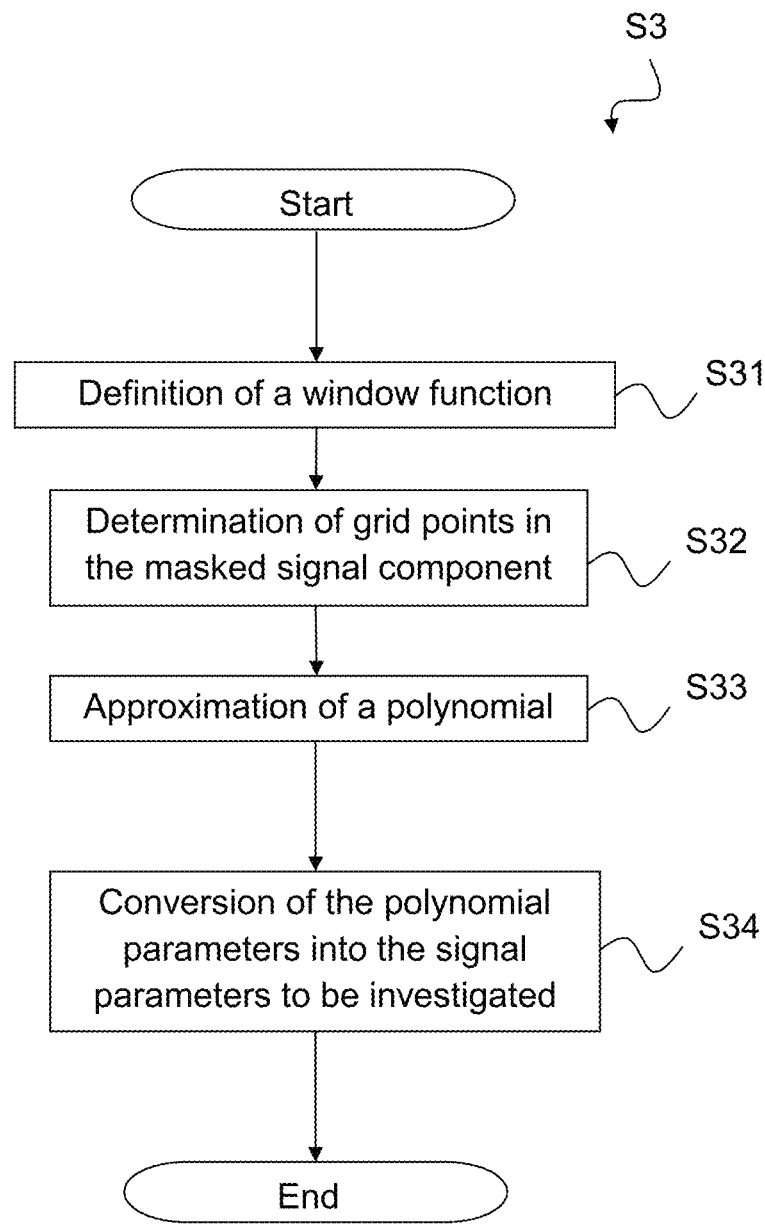
FIG. 3 an exemplary embodiment of a flow diagram of the investigation of the signal parameters according to the method of the invention.

FIG. 3 presents step S3 for the investigation of the signal parameters in greater detail. In step S31, a window function is therefore defined. This window function is applied, in particular, in the case of a display of a signal to be detected in a two-dimensional f/t plane. Accordingly, the window function is applied either line-wise or block-wise over the detected signal. In the following step S32, the determination of grid points in the masked signal component or in the unmasked signal component is implemented. In the next step S33, a polynomial is approximated or respectively interpolated on the basis of the grid points from step S32.

In step S34, the conversion of the polynomial parameters from the approximated polynomial into the signal parameter to be investigated takes place.

In this manner, the signal parameters are investigated. Even if this signal is noisy and provides inaccuracies, it is still possible, on the basis of the masking in step S2, to select the signal region to which a polynomial approximation will then be applied in a targeted manner. By means of the polynomial approximation, the grid points, for example, local minima or local maxima of the masked signal component or of the unmasked signal component, are described as a polynomial. The polynomial coefficients are then converted into signal parameters by means of the computer unit 4 of the measuring device 1. For this purpose, in particular, a start frequency, a stop frequency, a start time and a stop time of the masked signal component must be determined from the polynomial parameters. Additionally, a chirp rate and an angle are preferably determined from the polynomial. Furthermore, the data of the masked signal component can be demodulated and/or decoded, for example, in order to investigate whether a payload information or control information is present.

FIGS. 4 to 9 show the detected signal in a frequency-time plane. In this context, an amplitude spectrogram of the frequency f and the time t is shown in each case. The amplitude height is expressed through greyscales of the respective point. The lighter a point is, the larger the amplitude of the signal in this signal component. An alternative display, for example, a three-dimensional or coloured waterfall display is not excluded according to the invention.

Figure 4:
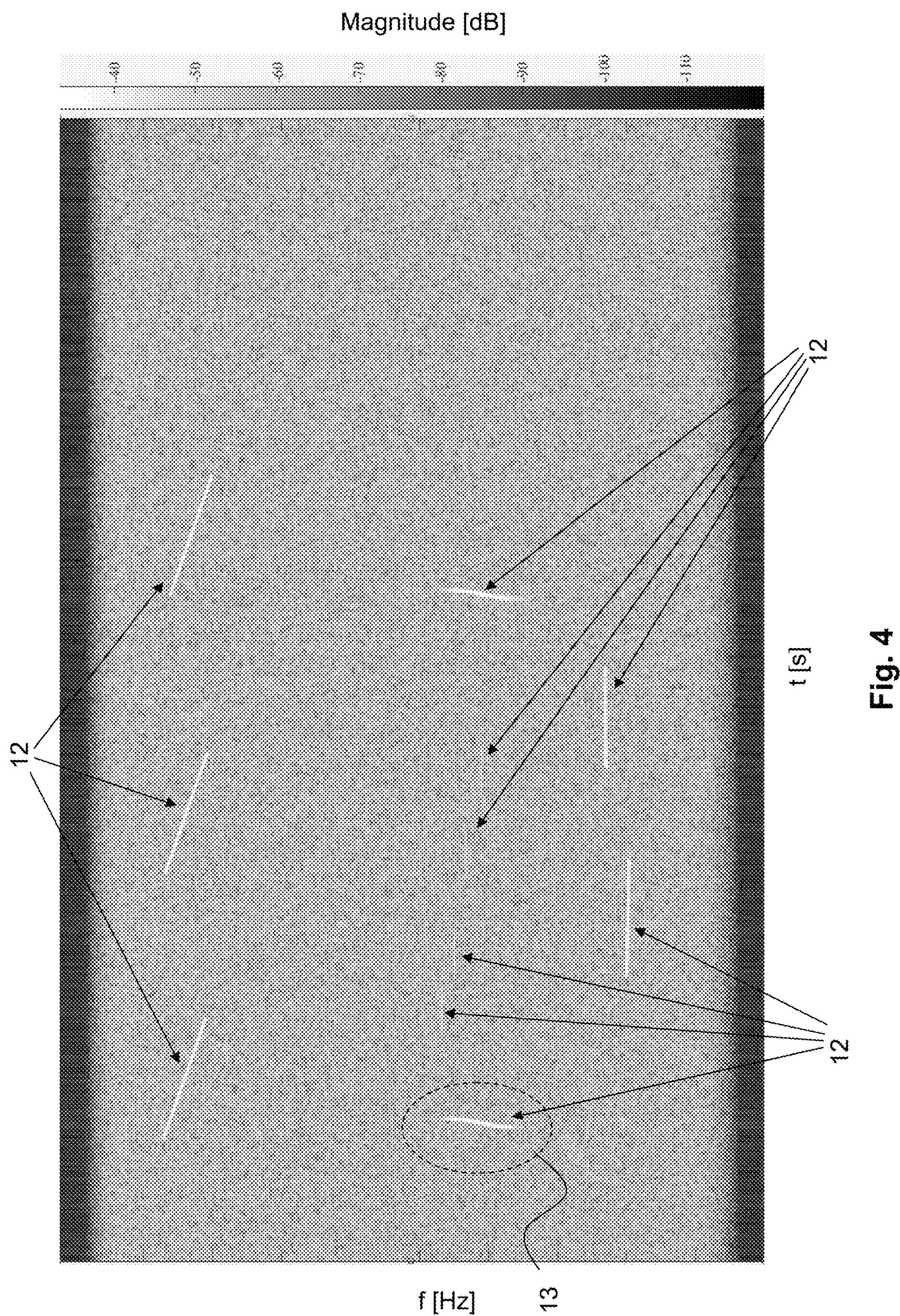
FIG. 4 an exemplary amplitude spectrogram of a displayed detected signal.

According to FIG. 4, the light regions therefore display signal components 12 of the connected signal in the measuring device 1. In this context, it is evident that three recurring signal components are shown in the upper region of the diagram. The extent to which further signal components are also contained in the signal on the basis of a low amplitude value cannot be identified by a user without doubt. Accordingly, the method according to the invention comes into use. The user of the measuring device 1 is now interested, for example, in the signal component 13, because this signal component should possibly not be contained in the detected signal, or this signal component provides an unusual characteristic, so that interference can be presumed.

Figure 5:
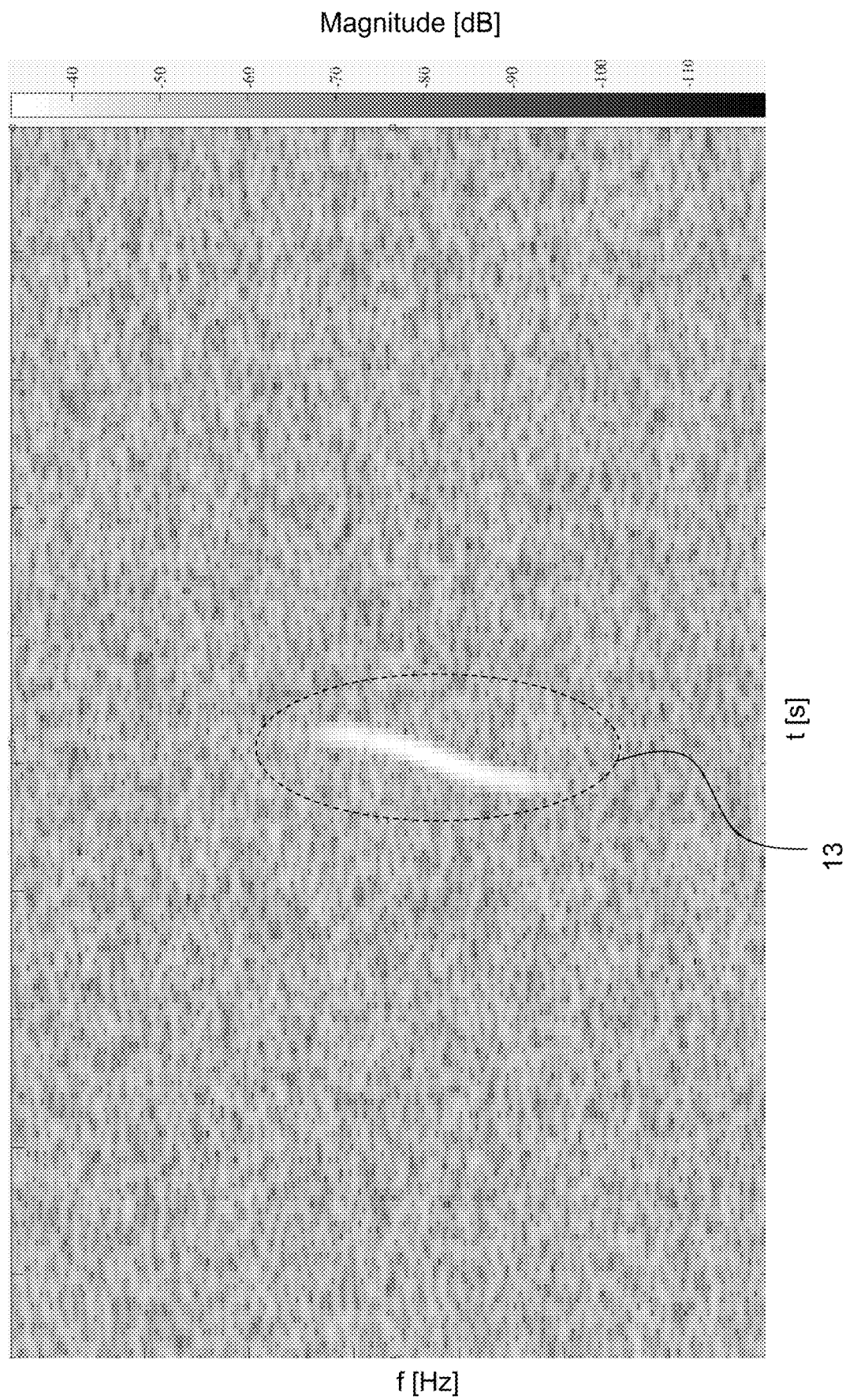
FIG. 5 an enlarged view of a signal component in the signal shown in FIG. 4.

FIG. 5 provides a more detailed illustration of the signal component 13. It is clearly evident that the signal component 13 is not a rectangular area and therefore cannot be determined via the signal parameters bandwidth and time duration. Accordingly, the user would not be able to find the signal component 13 by means of an automatic search based on the parameters for bandwidth and time duration. A corresponding automatic filtering in signal band or time duration would therefore also not allow an investigation of signal components of the detected signal which are similar to the signal component 13.

Figure 6:
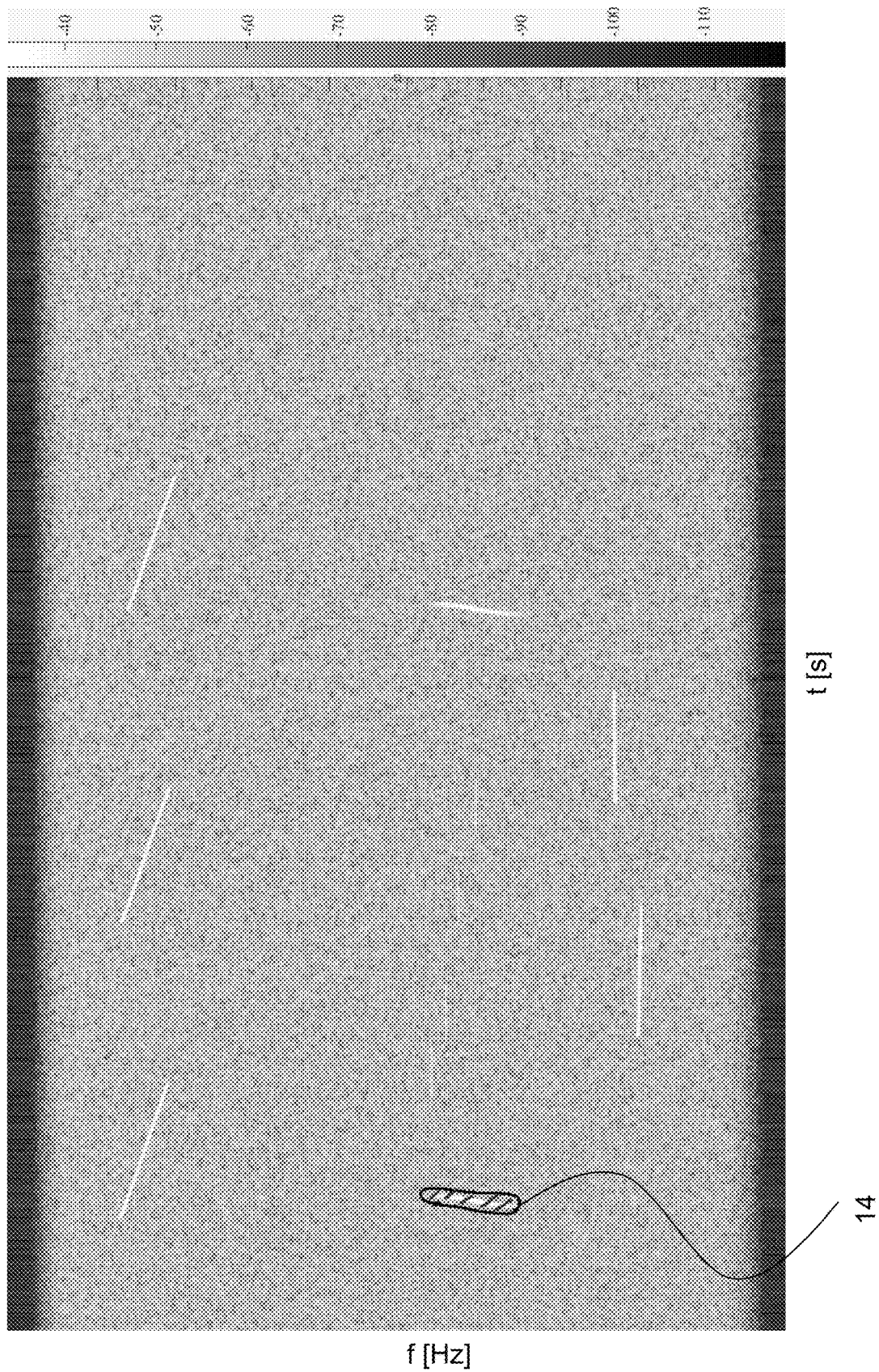
FIG. 6 a masking according to the invention in the amplitude spectrogram of the displayed, detected signal shown in FIG. 4.

FIG. 6 shows a manual masking 14 according to the method of the invention of the signal component 13 of FIG. 4 and FIG. 5. The masking 14 is implemented, for example, through a corresponding touching of a touch-sensitive screen 6 of the display element 5 in the measuring device 1, for example, by means of a stylus or with the user's finger. Alternatively, the masking 14 can also be implemented with a computer mouse or a corresponding cursor in the measuring device 1. To ensure that the user obtains an information regarding what s/he has masked, the masked region 14 is also displayed on the display element 5 as shown in FIG. 6.

Figure 7:
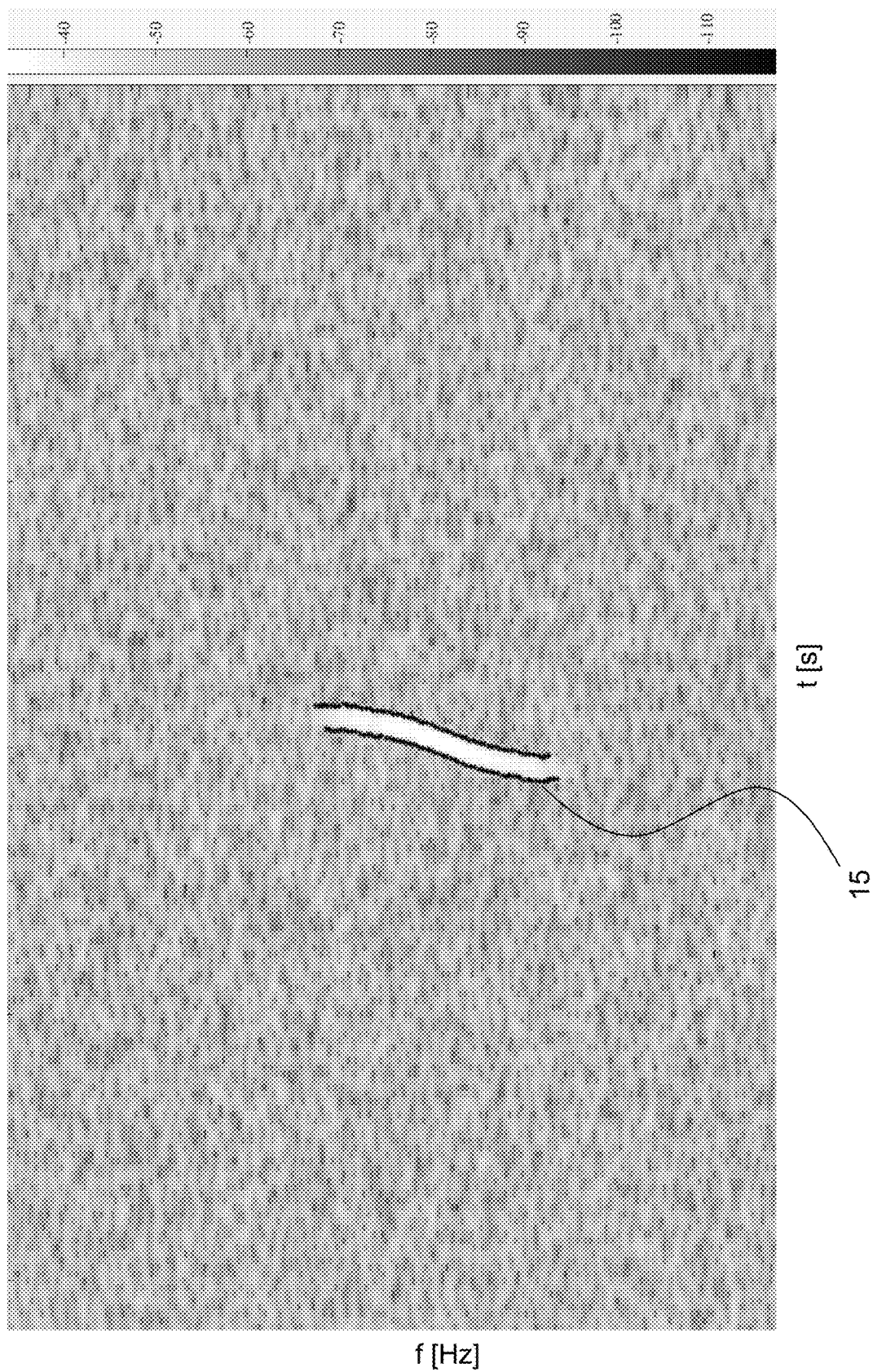
FIG. 7 a first exemplary embodiment for the determination of a signal component in the amplitude spectrogram of the displayed detected signal shown in FIG. 4.

FIG. 7 shows a determination 15 according to the method of the invention by the measuring device 1. In this context, the user receives the information that the signal parameters of the masked signal component 14 have been investigated by the measuring device 1 and the detected signal has been analysed, so that the masked signal component 14 has been recognisably marked, for example, through a corresponding marking 15 of the signal component. The signal component 13 can now be approximated by a polynomial. The corresponding polynomial is S-shaped. The signal component 13 can therefore be approximated by means of a third degree polynomial. A corresponding method for the identification of the grid points for the approximation of a polynomial is shown in FIG. 9.

Figure 8:
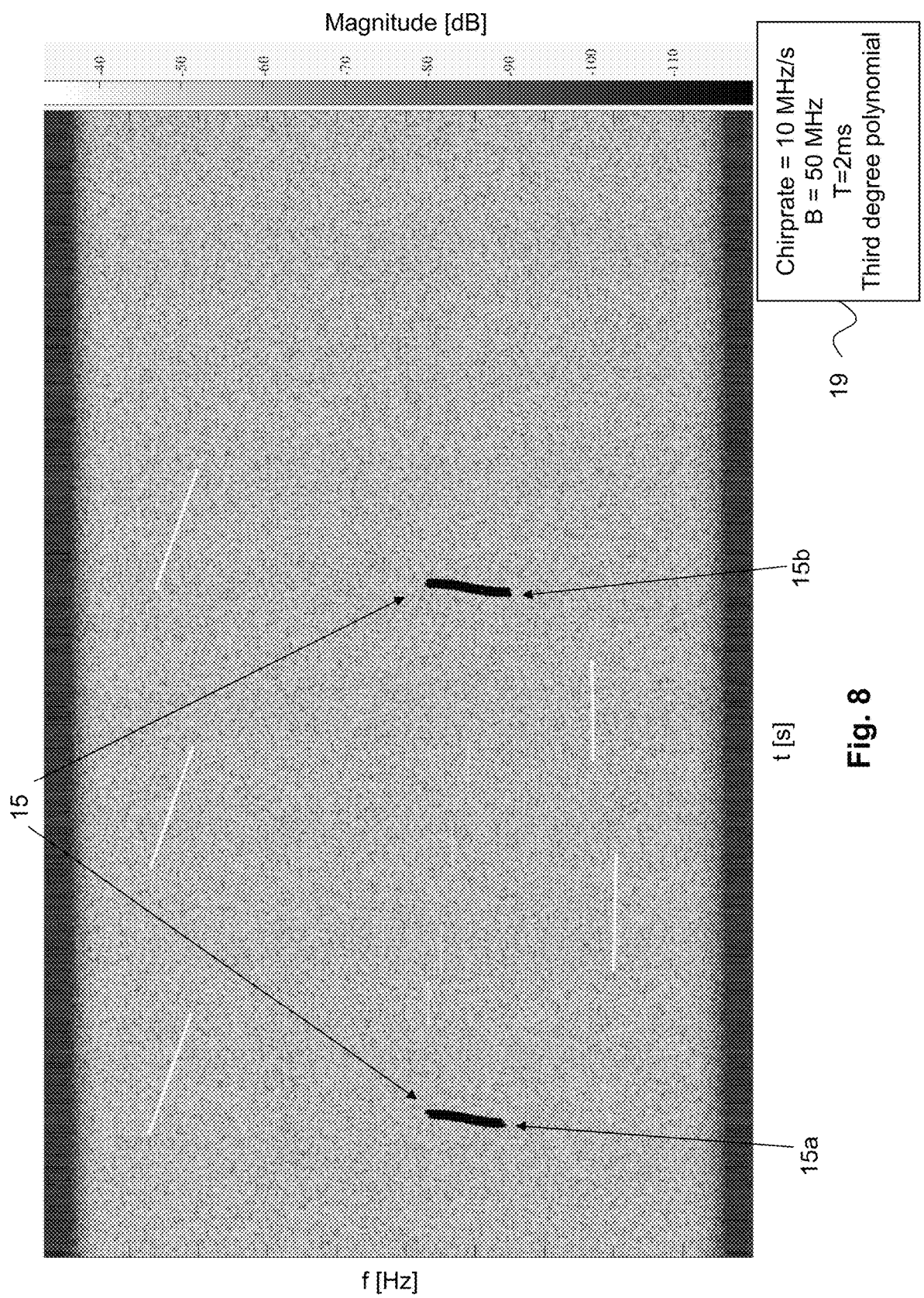
FIG. 8 a second exemplary embodiment for the determination of the signal component in the amplitude spectrogram of the displayed detected signal shown in FIG. 4.

FIG. 8 shows a further determination 15 by the measuring device 1 of the method according to the invention. As is evident with regard to the difference from FIG. 6, the right-hand signal component 15b is also marked alongside the left-hand masked signal component 15a because the investigated signal parameters describe both the left-hand signal component 15a and also the right-hand signal component 15b and are investigated in an analysis. In this manner, the user can now draw inferences regarding the periodicity of disturbances or undesired signal components. Furthermore, FIG. 8 shows an output window 19 in which the investigated signal parameters are displayed. Accordingly, the user receives the information regarding the signal parameters with which the marking 15 was implemented and which signal parameters these signal components 15 comprise.

Figure 9:
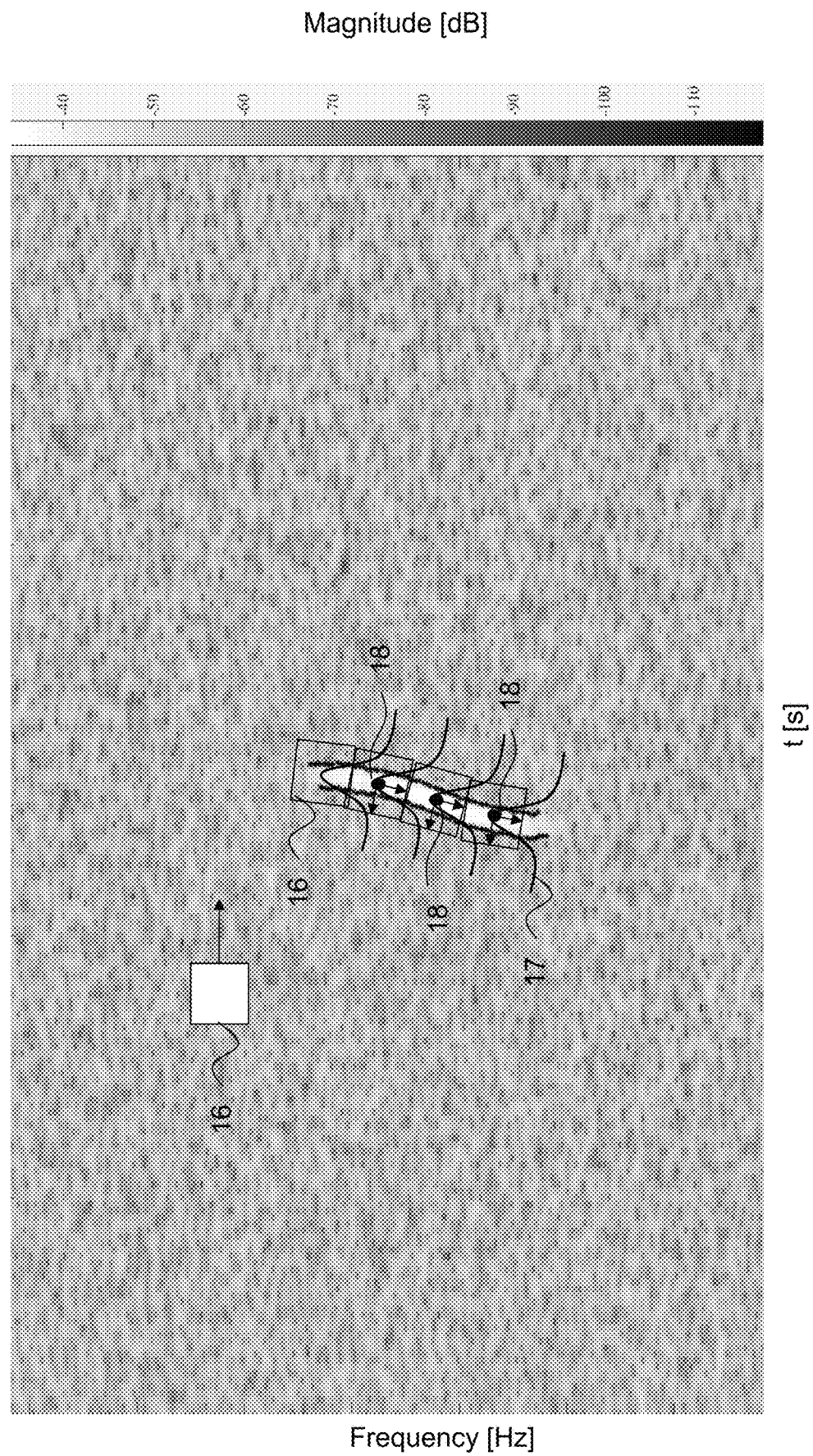
FIG. 9 an exemplary embodiment for the identification of grid points for a polynomial approximation according to the invention.

FIG. 9 shows an exemplary embodiment for obtaining grid points for a polynomial approximation for the method according to the invention. In this context, a window function 16 is applied line-wise or block-wise to the f/t plane of the amplitude spectrogram of the detected signal 12. In particular, the window 16 is applied in the masked signal component 14 in order to find grid points for a polynomial approximation.

Accordingly, the window 16 is aligned on the basis of the gradient of the masked signal component 14. This alignment is implemented in a vectorial manner. Accordingly, the window operator 16 is aligned on the basis of the gradient. The gradient is illustrated schematically by the lines 17. The line-wise operation of the window function 16 on the marked and masked region is illustrated in a simplified manner by four gradient characteristics 17. Accordingly, the gradient is evaluated line by line. The coordinates of the maximal value are buffered together with the maximal value of the line or respectively block and the rotation of the window 16, on the basis of the vectorial alignment.

When the window 16 has been applied to all lines or respectively blocks of the masked signal component 14, all coordinates of the maximal value form a polynomial. This polynomial is now approximated. In FIG. 9, three grid points 18 are obtained in this manner. With these three grid points 18, the polynomial is then approximated, for example, using the method of smallest errors squared. The polynomial obtained in this manner now describes not only the time duration and bandwidth, but also the angle information in the frequency/time amplitude spectrogram and the chirp rate of the signal component 13 in the detected signal.

Figure 10:
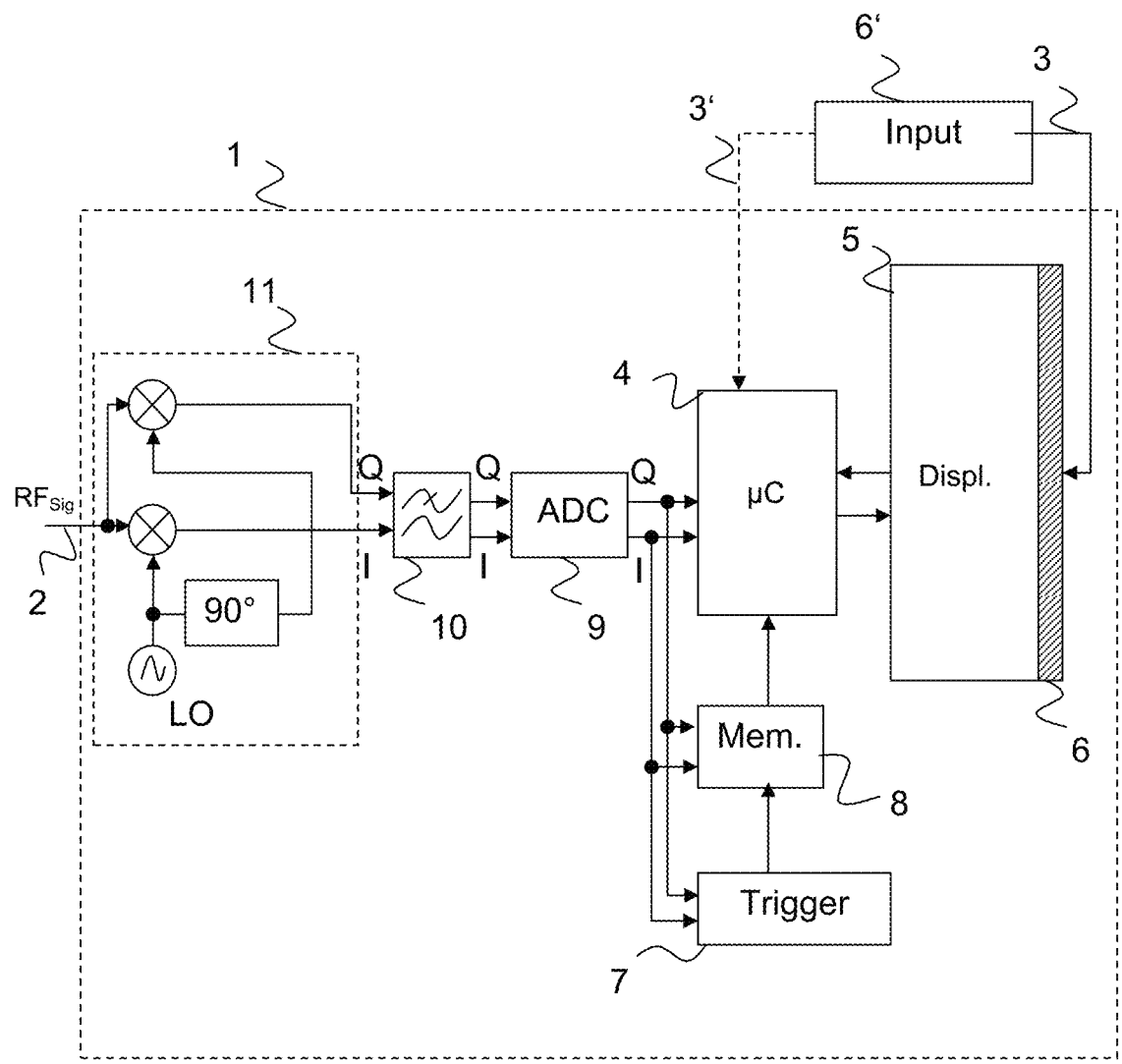
FIG. 10 an exemplary embodiment of a block-circuit diagram of the measuring device according to the invention.

FIG. 10 shows a measuring device 1 according to the invention. The measuring device 1 provides a measuring-device input 2 to which a high-frequency signal can be connected. Furthermore, the measuring device comprises an entry input 3. The entry input 3 can lead, in particular, to a touch-sensitive screen 6 of a display element 5 of the measuring device 1. Alternatively, and illustrated here by a dashed line, the entry input 3' is implemented directly at a processor. This is the case, in particular, if an input device 6', for example, a computer mouse, is used as the masking element.

Furthermore, for example, an I/Q demodulator 11 is provided in the measuring device 1 in order to apply an I/Q demodulation to the input signal of the input 2. Following this, a low-pass filtering by means of the filter 10 and an analog/digital conversion according to the analog/digital converter 9 is applied to the input signal. In a computer unit 4, the signal is finally conditioned in such a manner that it can be displayed on a display element 5. For this purpose, for example, an amplitude information or a power information of the signal is displayed on a two-dimensional frequency/time plane in order to obtain the views shown in FIGS. 4 to 9.

Furthermore, a memory 8 is provided in order to store signal data of the signal to be detected. By means of a trigger unit 7, it is possible to define which signal components are to be evaluated. For example, the display element 5 comprises a touch-sensitive screen 6, by means of which the user can implement a masking of displayed signal components. This masking 14 is communicated to the processor 4. Following this, the investigation of signal parameters is implemented according to the method described above. A trigger is then adjusted to the investigated signal parameters, and all signal components 15 which provide the investigated signal parameters are determined and displayed on the display element 5.

In this manner, it is possible to display interference signals from radar system which, on the one hand, are very weak and are accordingly subsumed in the noise of the signal. An automatic detection of these interference signals is not possible or occurs only to a limited extent, since the engagement of a trigger on these interference signals is not possible, because a trigger could not detect such a signal component 13. Alternatively, interference signals are present simultaneously at different positions in the signal spectrum. In this case also, a trigger cannot be used to engage on one of these signal components 13.

It is therefore proposed according to the invention to implement a pre-selection of the interference signals or a pre-analysis of the interference signals, which is made possible through the provision of masking elements, such as the touch-sensitive screen 6 or the input device 6'. In this manner, for example, frequency-modulated transient measurements could be used in the search for signal features.

By way of example, the degree of the polynomial, the start frequency, the stop frequency, the bandwidth, the start time, the stop time, the time duration, the angle and/or the chirp rate can be analysed as the signal parameters. Accordingly, relatively stronger signals can also be filtered out, in particular, in order to be able to display the interesting signal components 13 in an improved manner.

In this manner, duplicities or similarities which have hitherto not been visible in the spectrum can be displayed. The model search required for this is implemented, in particular, through the two-dimensional gradient search in which a window function 16 is applied. Through the vectorial alignment of the window 16, grid points 18 can be investigated in order to determine the degree of the polynomial.

In an alternative embodiment, an investigation of the signal parameters is implemented on the basis of the buffered signal data, wherein a cross-correlation filter is obtained as an ideal reference filter with the signal parameters.

The invention is not restricted to the exemplary embodiments presented. Instead of the preferred manual masking, an automatic marking may also be considered. All of the features described, illustrated or claimed can be combined arbitrarily with one another within the scope of the invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method of automatically determining signal parameters in an electrical measuring device with a display element, the method comprising:
    displaying a detected signal that includes at least one unmasked signal component or masked signal component on the display element, wherein an amplitude information or a power information of the detected signal is displayed on a two-dimensional frequency and time plane,
    manual masking to make a manually masked signal component of at least one unmasked signal component or masked signal component of the detected signal by means of a masking element of the measuring device, the manual masking comprising applying a window function line-wise or block-wise in the frequency and time plane to the at least one unmasked signal component or masked signal component,
    determining grid points in the manually masked signal component, wherein determining a grid point of the grid points comprises determining at least one of a local minimum or a local maximum associated with the manually masked signal component;
    interpolating, based on the grid points, a polynomial representing the manually, masked signal component, and
    determining, based on the polynomial representing the manually masked signal component, signal parameters of the manually masked signal component by the measuring device, wherein the signal parameters comprise a time duration and a bandwidth of the manually masked signal component.

2. The method according to claim 1,
    wherein a user masks the at least one masked signal component or unmasked signal component by means of a finger touch on a touch-sensitive screen as the masking element of the measuring device.

3. The method according to claim 1,
    wherein at least one further signal parameter is determined alongside a time duration and a bandwidth of a masked signal component.

4. The method according to claim 1,
    wherein the detected signal is analyzed by means of the determined signal parameters, wherein signal components of the detected signal with similar or identical determined signal parameters are determined by means of the measuring device.

5. The method according to claim 4,
    wherein the determined, analyzed signal components are recognizably marked on the display element of the measuring device.

6. The method according to claim 1,
    wherein the determined signal parameters are output on the display element.

7. The method according to claim 1,
    wherein the at least one unmasked signal component or masked signal component is approximated by the polynomial.

8. The method according to claim 7,
    wherein polynomial coefficients approximate the phase of the at least one unmasked signal component or masked signal component with the polynomial.

9. The method according to claim 1,
    wherein the grid points for an approximation of the polynomial are determined by means of the window function applied line-wise or block-wise in the frequency/time plane, wherein smallest errors squared are determined.

10. The method according to claim 5,
    wherein the window function is aligned with a gradient of a power or amplitude of a signal in the masked signal component or in the unmasked signal component.

11. The method according to claim 1,
    wherein the masked signal component defines a time duration and a bandwidth as signal parameters, which are obtained from the signal data of the detected signal.

12. The method according to claim 1,
    wherein signal components which are rejected for the determining of the signal parameters are determined by the masking.

13. The method according to claim 1,
    wherein a threshold-value filter is applied to the masked signal components or the unmasked signal components.

14. A measuring device, comprising
    a signal input, for connection of an analog signal to be detected;
    an analog-digital converter, for the conversion of the analog signal into a digital signal to be detected;
    a display element for the display of the detected digital signal that includes at least one unmasked signal component or masked signal component, wherein an amplitude information or a power information of the signal to be detected is displayed on a two-dimensional frequency and time plane;
    a masking element for manual masking to make a manually masked signal component of the at least one unmasked signal component or masked signal component of the detected signal, the manual masking comprising applying a window function line-wise or block-wise in the frequency and time plane to the at least one unmasked signal corn orient or masked signal component;
    a computer unit for:
        determining grid points in the manually masked signal component, wherein determining a grid point of the grid points comprises determining at least one of a local minimum or a local maximum associated with the manually masked signal component are determined;

interpolating, based on the grid points, a polynomial representing the manually masked signal component; and determining, based on the polynomial representing the manually masked signal component signal parameters of the manually masked signal component, wherein the signal parameters comprise a time duration and a bandwidth of the manually masked signal component.

15. The measuring device according to claim 14, wherein the masking element is a touch-sensitive screen of the display element or an input device of the measuring device.

16. The measuring device according to claim 14, wherein a marking unit is provided in the measuring device, and wherein the determined signal parameters are supplied to the marking unit, wherein the marking unit marks signal components of the detected signal with similar or identical signal parameters.

\* \* \* \* \*